United States Patent [19]
Lee et al.

[11] Patent Number: 5,764,560
[45] Date of Patent: Jun. 9, 1998

[54] APPARATUS AND METHOD FOR SIMULTANEOUSLY REPRODUCING MULTIPLE AUDIO SIGNALS RECORDED ON A SEMICONDUCTOR MEMORY CARD

[75] Inventors: Young-Man Lee, Suwon; Myung-Jong Song, Ahnyang, both of Rep. of Korea

[73] Assignee: Samsung Electronics Co., Ltd., Kyungki-do, Rep. of Korea

[21] Appl. No.: 689,003

[22] Filed: Jul. 30, 1996

[30] Foreign Application Priority Data

Sep. 29, 1995 [KR] Rep. of Korea .............. 33101/1995

[51] Int. Cl.$^6$ .............................................. G11C 27/00
[52] U.S. Cl. ............................... 365/45; 365/185.03
[58] Field of Search .................. 365/45, 185.03, 365/189.01

[56] References Cited

U.S. PATENT DOCUMENTS 4,234,761 11/1980 Wiggins, Jr. et al. .................. 365/45
4,234,928 11/1980 Pfeifer ..................................... 365/45
5,477,487 12/1995 Greenberg ......................... 365/189.01

*Primary Examiner*—David C. Nelms
*Assistant Examiner*—Michael T. Tran
*Attorney, Agent, or Firm*—Sughrue, Mion, Zinn, Macpeak & Seas, PLLC

[57] ABSTRACT

An apparatus and method for reproducing multiple sound using a semiconductor memory card. The apparatus includes a recording medium, a key input section, a system controlling section, a memory controlling section, a data separating section and an expanding section. When the plurality of music data recorded on the recording medium is selected to be simultaneously reproduced, the selected music data is sequentially transferred to respective channel memories. Then, the music data stored per channel is simultaneously reproduced to enable simultaneous listening of several pieces of music via a single music reproducing apparatus.

10 Claims, 8 Drawing Sheets

| ADDRESS | DATA |
|---|---|
| 000010 H | XXXXXXXXXXX |
| FIRST MUSIC | |
| 001000 H | XXXXXXXXXXX |
| SECOND MUSIC | |
| 011000 H | XXXXXXXXXXX |
| THIRD MUSIC | |
| 100000 H | XXXXXXXXXXX |
| FOURTH MUSIC | |
| 101011 H | XXXXXXXXXXX |
| FIFTH MUSIC | |
| 111111 H | XXXXXXXXXXX |

| 00000000 B | FIRST SELECT MUSIC 256BYTE MEMORY (CH1 MEMORY) |
|---|---|
| 11111111 B | |

Fig. 5B

| 00000000 B | SECOND SELECT MUSIC 256BYTE MEMORY (CH2 MEMORY) |
|---|---|
| 11111111 B | |

Fig. 5C

| 00000000 B | THIRD SELECT MUSIC 256BYTE MEMORY (CH3 MEMORY) |
|---|---|
| 11111111 B | |

APPARATUS AND METHOD FOR SIMULTANEOUSLY REPRODUCING MULTIPLE AUDIO SIGNALS RECORDED ON A SEMICONDUCTOR MEMORY CARD

BACKGROUND OF THE INVENTION

1. Field of the Invention

The present invention relates to an apparatus and method for reproducing multiple audio signals using a semiconductor memory card, and more particularly to an apparatus for reproducing multiple audio signals using a semiconductor memory card, wherein audio data is recorded on the semiconductor memory card, and several audio signals may be simultaneously reproduced via several channels.

The present application for an apparatus for reproducing multiple audio signals using a semiconductor memory card is based on Korean Application No. 33101/1995 which is incorporated herein by reference for all purposes.

2. Description of the Related Art

In conjunction with the recent increase of the packing density in a semiconductor memory card, techniques for using a light, thin and compact memory card as a recording medium for storing and reproducing audio data or image data have been suggested.

An apparatus for using the memory card in recording such data is disclosed in U.S. Pat. No. 4,813,014 which describes a technique for storing music data. Also, Korean Patent Application No. 12148 filed by the present applicant in 1994 describes a portable recording and reproducing apparatus in which a memory card is employed for recording audio information. When audio data is reproduced from a memory card, a single audio signal is reproduced via one designated channel. Thus, the other audio signals recorded on the memory card cannot be simultaneously reproduced.

SUMMARY OF THE INVENTION

It is an object of the present invention to provide an apparatus and method for simultaneously reproducing multiple audio signals from a memory card wherein, to solve the above-described problem, audio data is recorded on a semiconductor memory card to reproduce a plurality of audio signals via a plurality of channels.

It is another object of the present invention to provide an apparatus and method for simultaneously reproducing several audio signals by means of a single acoustical apparatus in sound equipment using a semiconductor memory card.

To achieve the above objects of the present invention, an apparatus for reproducing multiple audio signals includes a recording medium recorded with compressed music data for providing the music data selected under a predetermined control and a key input section provided with various function keys such as a record key, a selection key and a stop key for selecting desired music. A system controlling section generates a channel memory selection signal and read and write clocks for controlling the simultaneous reproduction of several pieces of music in the music data recorded on the recording medium in accordance with the selection key of the key input section. A memory controlling section generates an address for reading out the music data recorded on the recording medium under the control of the system controlling section. A data separating section receives the multiple-selected music data from the recording medium and stores or reads out the music data by channel in accordance with the channel memory selection signal, read clock signal and write clock signal output from the system controlling section. Expanding sections expand compressed music data read out on a channel by channel basis from the data separating section.

To achieve the other object of the present invention, a method for reproducing multiple audio signals is performed by selecting the desired plurality of pieces of music to read out sequentially the music data selected from the recording medium, and classifying and storing the music data read out from a recording medium in accordance with the kind of music. Then, after the music data is classified and stored, the music data is simultaneously read out to be reproduced.

BRIEF DESCRIPTION OF THE DRAWINGS

FIG. 4 is a view showing a memory map of the recording medium according to the present invention;

FIGS. 5A to 5C show the state of the internal addresses per channel of the memories according to the present invention;

DETAILED DESCRIPTION OF THE PREFERRED EMBODIMENT

An apparatus and method for reproducing audio data using a semiconductor memory card according to the present invention will be described in detail with reference to the accompanying drawings.

Figure 1:
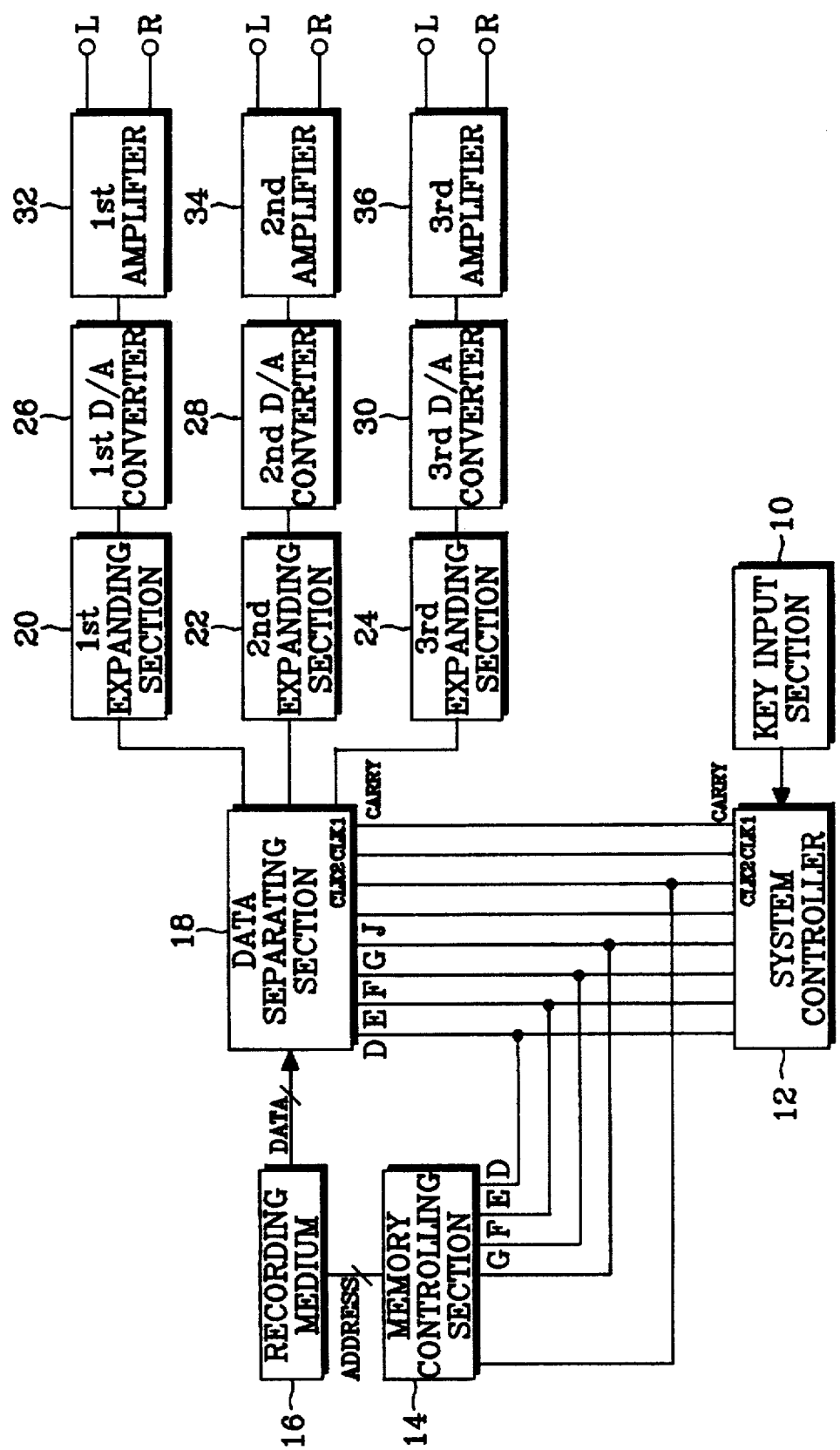
FIG. 1 is a block diagram showing a construction of an audio data reproducing apparatus using a semiconductor memory card according to one embodiment of the present invention.

FIG. 1 is a block diagram showing a construction of the audio data reproducing apparatus using a semiconductor memory card according to one embodiment of the present invention. Here, a key input section 10 is provided with various function keys such as a record key, a select key, and a stop key to produce an instruction in accordance with a key input, thereby allowing for the selection of one or more pieces of music. A system controller 12 generates a control signal in accordance with the input key data output from key input section 10. A recording medium 16, recorded with compressed music data, provides the music data selected under a predetermined control. Memory controlling section 14 performs the multiple music selection of the music data recorded on recording medium 16 to output the data under the control of system controller 12. A data separating section 18 receives the multiple-selected music data from recording medium 16 under control of memory controlling section 14 to store or read out respective music data by channel in accordance with a channel memory selection signal, a read clock CLK1 and a write clock CLK2 of system controller 12. First, second and third expanding sections 20, 22 and 24 expand compressed music data read out from data separating section 18 by channel, thereby providing the expanded music data. First, second and third digital-to-analog (D/A) converters 26, 28 and 30 respectively convert the digital music data expanded to be provided per channel from first to third expanding sections 20, 22 and 24 into analog music data. First, second and third amplifiers 32, 34 and 36 respectively amplify the signals converted into the analog music data from first to third D/A converters 20, 22 and 24 to a predetermined level to output the selected music.

Figure 2:
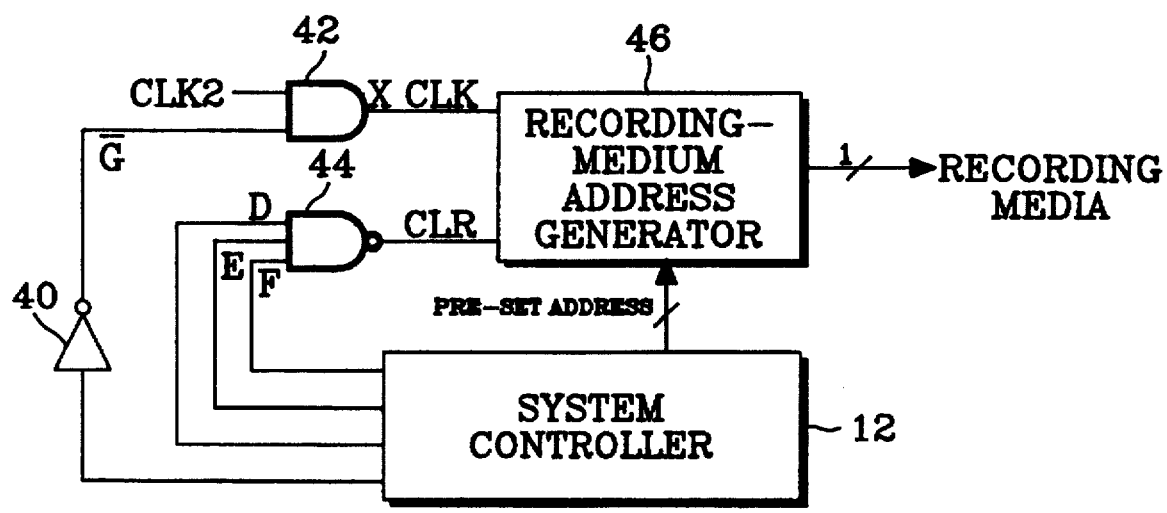
FIG. 2 is a detailed circuit diagram showing the memory controlling section of FIG. 1.

FIG. 2 is a detailed circuit diagram showing the memory controlling section shown in FIG. 1. A playback/record interval setting signal G generated from system controller 12 is inverted via an inverter 40 to be supplied as one input of an AND gate 42 which then performs the AND operation upon inverted integral setting signal $\overline{G}$ and write clock signal CLK2, thereby supplying the logical product to a recording-medium address generator 46. A NAND gate 44 performs the NAND operation upon channel memory selection signals D, E and F produced from system controller 12 to supply the result as a clear signal CLR to the recording-medium address generator 46. Following this operation, recording-medium address generator 46 receives a pre-set address generated from system controller 12 and a signal from AND gate 42 as a clock to generate a recording medium address.

Figure 3:
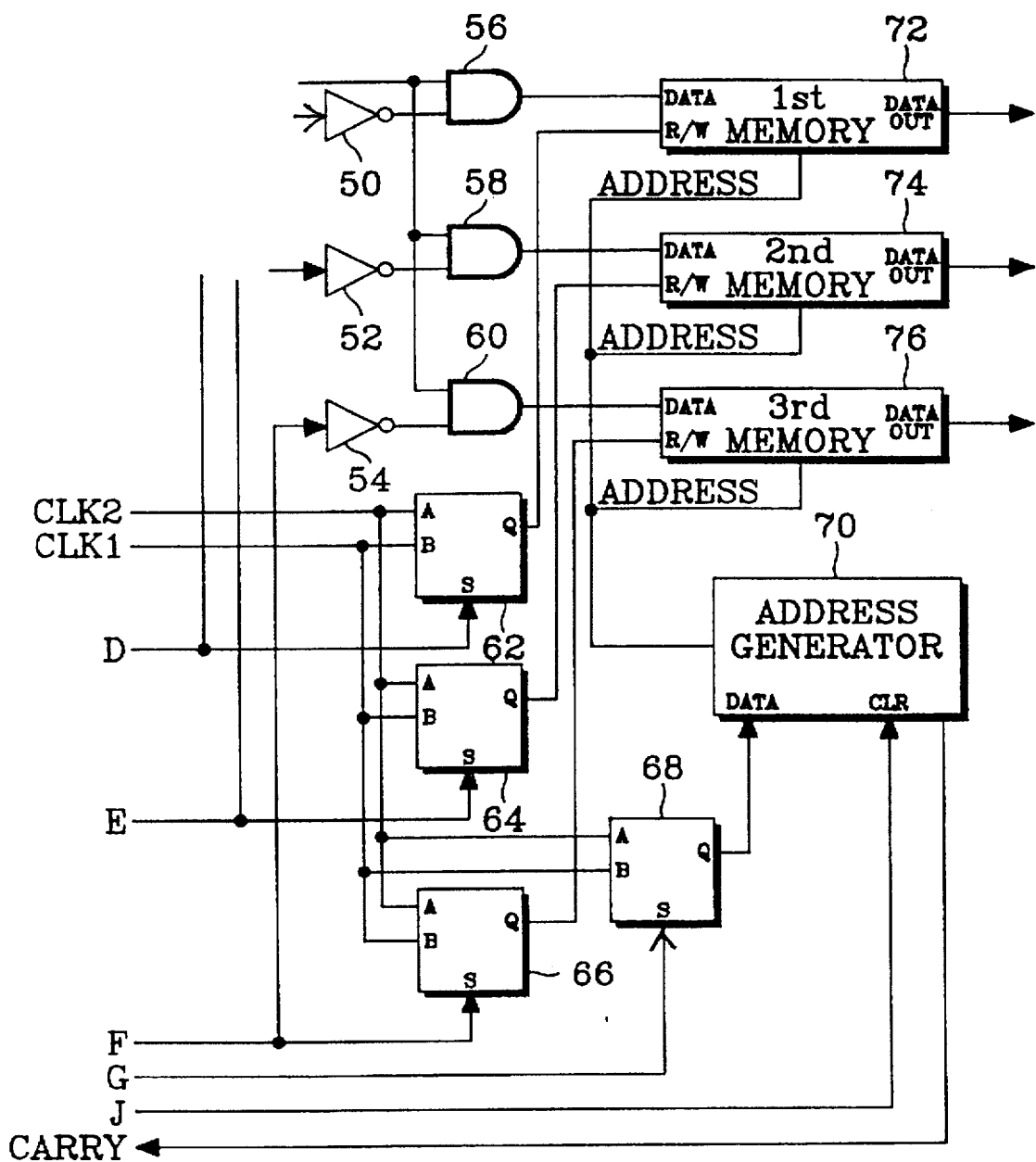
FIG. 3 is a detailed circuit diagram showing the data separating section of FIG. 1.

FIG. 3 is a detailed circuit diagram showing the data separating section of FIG. 1, in which three inverters 50, 52 and 54 invert channel memory selection signals D, E and F generated from system controller 12 to provide them as respective inputs to three AND gates 56, 58 and 60. Then, three AND gates 56, 58 and 60 perform the AND operation upon the music data from recording medium 16 and inverted channel memory selection signals $\overline{D}$, $\overline{E}$ and $\overline{F}$ to supply the result of the logical product to memories 72, 74 and 76. First, second and third multiplexers 62, 64 and 66 respectively select either one of read clock signal CLK1 and write clock signal CLK2 in accordance with channel memory selection signals D, E and F generated from system controller 12, so that the selected signals are provided to respective memories 72, 74 and 76. A fourth multiplexer 68 selects either one of read clock signal CLK1 and write clock signal CLK2 in accordance with the playback/record interval setting signal G generated from system controller 12 to supply the selected signal to address generator 70. After being cleared by the interval setting signal G generated from system controller 12, address generator 70 produces read and write addresses in accordance with the clock signal selected by fourth multiplexer 68 to provide the result to respective memories 72, 74 and 76. The above-mentioned first, second and third memories 72, 74 and 76 respectively receive the music data provided after being subjected to the AND operation from AND gates 56, 58 and 60 to read or write the data in accordance with the address generated from address generator 70.

FIG. 4 is a view showing a memory map of the recording medium according to the present invention. Here, the recording medium is recorded with several pieces of music and each piece of music is characterized by a start address which is associated with corresponding music data.

FIGS. 5A to 5C show the states of the internal addresses per channel of the three memories 72, 74, and 76 according to the present invention.

More specifically, FIG. 5A illustrates the first 256-byte memory stored with the first music selection at addresses 00H~FFH. FIG. 5B is the second 256-byte memory stored with the second music selection at addresses 00H~FFH, and FIG. 5C is the third 256-byte memory stored with the third music selection at addresses 00H~FFH.

Figure 6A:
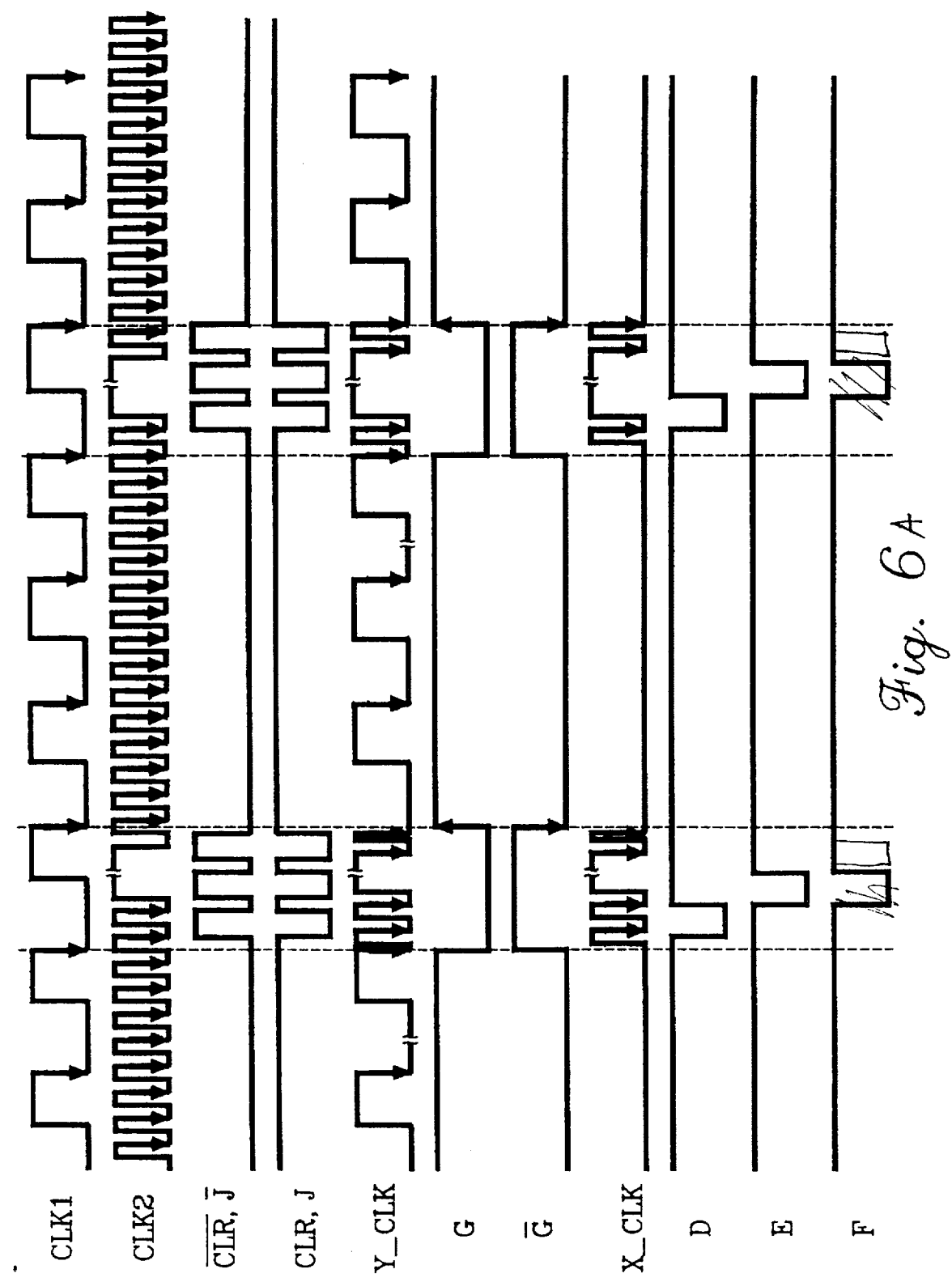
FIGS. 6A and 6B show operational waveforms of respective sections according to the present invention.
Figure 6B:
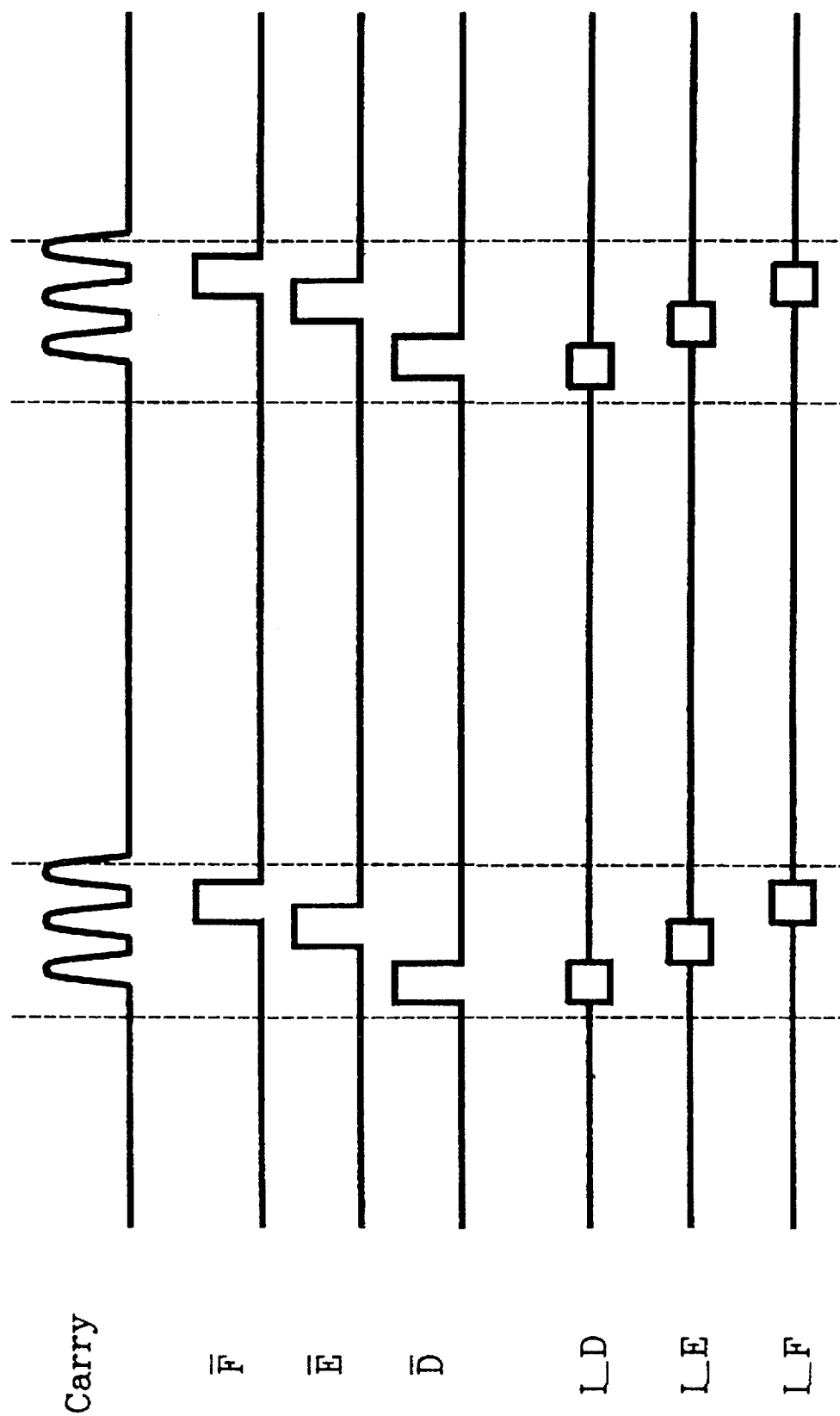
Figure 7A:
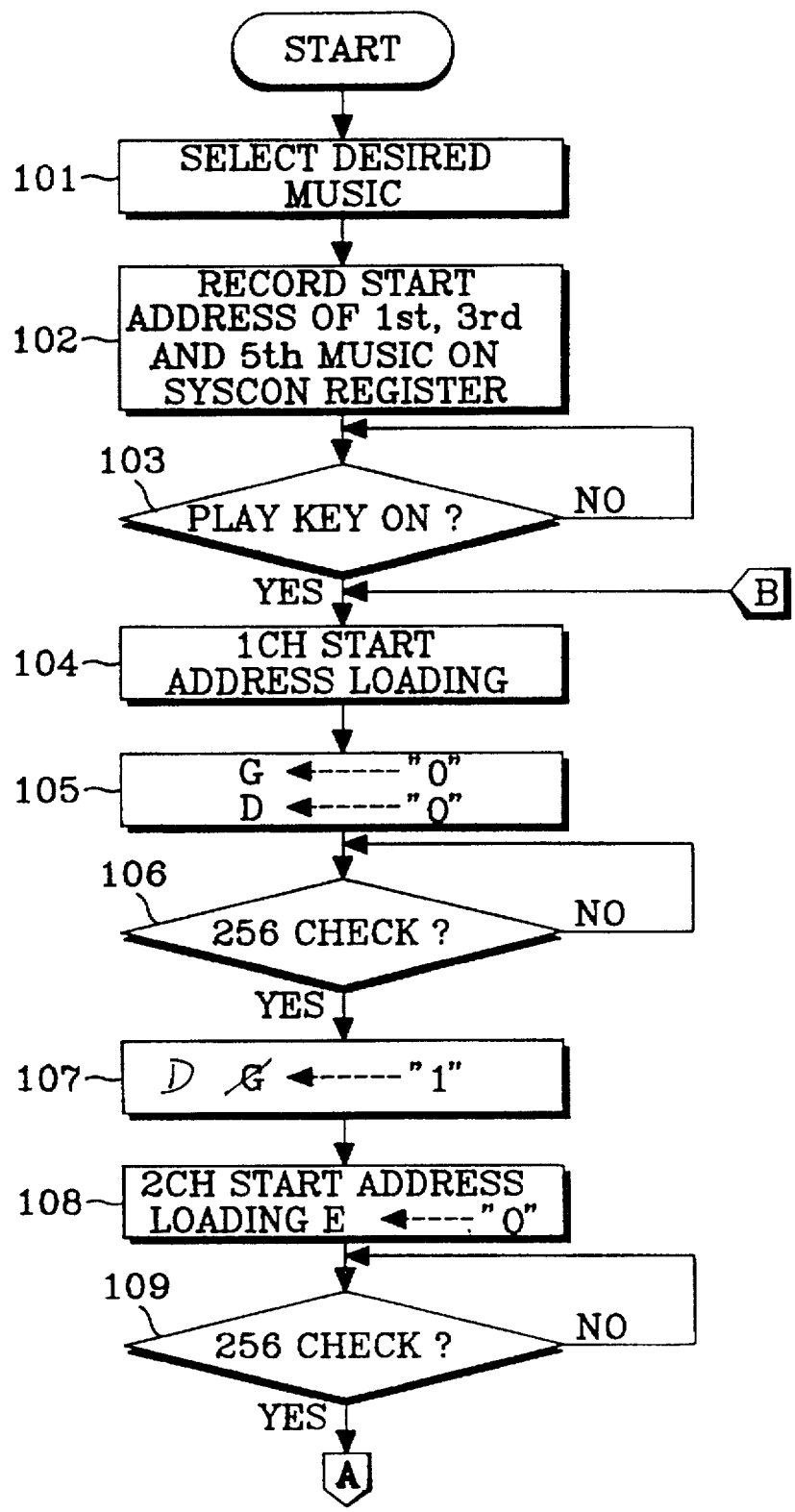
FIGS. 7A and 7B are control flowcharts for simultaneously reproducing music data of several songs according to the present invention.
Figure 7B:
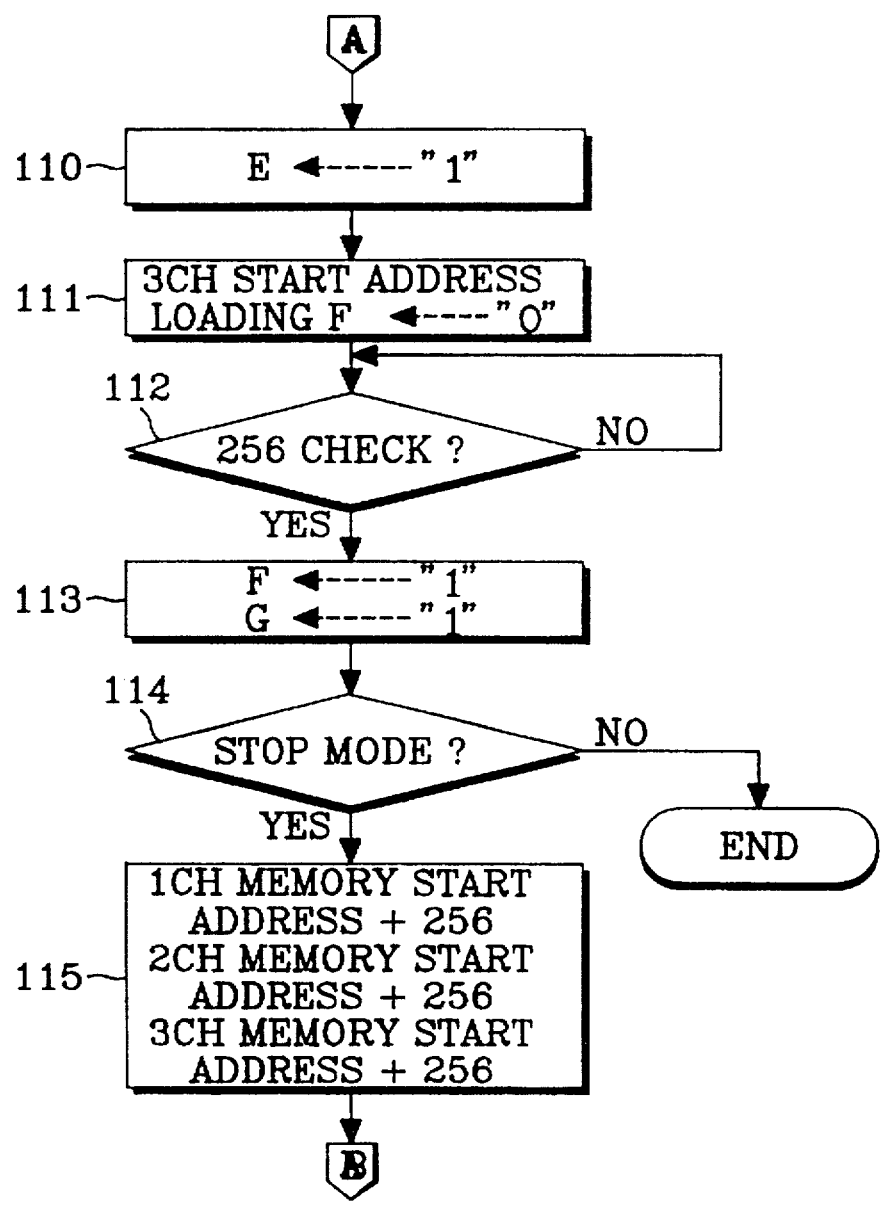

FIGS. 6A and 6B show operational waveforms of respective sections according to the present invention, and FIGS. 7A and 7B are control flowcharts for simultaneously reproducing music data of several pieces of music according to the present invention.

Referring to the aforementioned FIGS. 1 to 7, one preferred embodiment of the present invention will be described in detail.

As an initial matter, recording medium 16 is recorded with the plurality of compressed music data as shown in FIG. 4. A user selects a piece of music from the music data recorded in recording medium 16. Referring to FIG. 7A, in step 101, system controller 12 receives information for music selection. For example, if the music selection keys selected are 1, 3 and 5, system controller 12 stores the start addresses corresponding to the first, third and fifth music selections in a syscon register in step 102. In step 103, system controller 12 checks whether a play key signal is provided from key input section 10. When the play key signal is supplied, in step 104, system controller 12 provides the start address of the first music selection among the start addresses for first, third and fifth music selections stored in the syscon register to recording-medium address generator 46 shown in FIG. 2. The recording medium address generator may comprise a preset counter. The preset counter does not begin the counting from zero but designates a specific address, incremented one by one to count from the designated count value. In step 105, system controller 12 sets first channel memory selection signal D and playback/record interval setting signal G to zero. First channel selection signal D produced from system controller 12 is subjected to the NAND operation via NAND gate 44 to be inverted into $\overline{D}$ as shown in FIG. 6, thereby clearing recording-medium address generator 46. Then, playback/record interval setting signal G is inverted into $\overline{G}$, as shown in FIG. 6A, via inverter 40, to be supplied to AND gate 42. At this time, AND gate 42 performs the AND operation upon the write clock signal as CLK2 shown in FIG. 6A from system controller 12 and $\overline{G}$ to supply the result as the clock signal of recording-medium address generator 46 as X_CLK shown in FIG. 6A. Therefore, recording-medium address generator 46 produces the address with respect to the first music selection to supply it to recording medium 16. Then, recording medium 16 is read out to provide the music data corresponding to the start address of first selection. Also, first channel memory selection signal D generated from system controller 12 is inverted via inverter 50 to be supplied to AND gate 56 which performs the AND operation upon the data read out from recording medium 16 and inverted signal $\overline{D}$ to produce the logical product to first memory 72. At this time, since the first multiplexer 62 is supplied with a low signal corresponding to first channel memory selection signal D via a selection terminal S, write clock signal CLK2 supplied to an input terminal A is selected to be provided to a read/write loading terminal R/W of first memory 72. Additionally, fourth multiplexer 68 is supplied with a low signal corresponding to the interval setting signal G via a selection terminal S. Thus, write clock signal CLK2 supplied to input terminal A is selected to be supplied as the clock of address generator 70. By so doing, address generator 70 generates addresses augmented from zero to 255, thereby providing the generated address as the address for the first memory 72. Accordingly, first memory 72 writes the first music selection data I_D shown in FIG. 6B, which is received via AND gate 56 as the address continuously augmented from zero to 255. Here, address generator 70 has an output value of zero once the counting value reaches 256 while being augmented from zero to 255, so that the output value is provided to system controller 12 as a carry signal. Thus, in step 106, system controller 12 determines whether the counting number is augmented or not in accordance with the input of the carry signal. If the counting is augmented to 256 in step 106, the program proceeds to step 107. Thus, system controller 12 sets first channel memory selection signal D to one to stop the write operation into first memory 72. Once the music data with respect to the first music selection is finished, system controller 12 supplies the second channel memory selection signal as E shown in FIG. 6A to memory controlling section 14 to generate the start address of the third selection. At this time, system controller 12 provides the start address of the third music selection stored in the syscon register to recording-medium address generator 46 comprising the preset counter. In addition, system controller 12 sets the second channel memory selection signal to zero as E shown in FIGS. 6A and 7A. Second channel memory selection signal E produced from system controller 12 is subjected to the NAND operation via NAND gate 44 to be inverted as $\overline{E}$ shown in FIG. 6B, thereby clearing recording-medium address generator 46. Then, selected-music playback/record interval setting signal G is inverted by inverter 40 such that $\overline{G}$ is supplied to AND gate 42. At this time, AND gate 42 performs the AND operation upon the write clock signal CLK2 shown in FIG. 6A generated from system controller 12 and the inverted playback/record interval setting signal $\overline{G}$ to supply the logical product as the clock signal X_CLK to recording-medium address generator 46. In response to the clock signal, recording-medium address generator 46 generates the address with respect to the third music selection to supply the address to recording medium 16 which then reads out information to supply the music data with respect to the third music selection. Also, second channel memory selection signal E from system controller 12 is inverted via inverter 52 to be supplied to AND gate 58 which performs the AND operation upon the data read out from recording medium 16 and inverted signal $\overline{E}$ to supply the logical product to second memory 74. At this time, since first multiplexer 64 is supplied with the low signal corresponding to second channel memory selection signal E to selection terminal S thereof, write clock signal CLK2 received via input terminal A is selected to be supplied to read/write loading terminal R/W of second memory 74. Fourth multiplexer 68 supplied with the low signal corresponding to the playback/record interval setting signal as G shown in FIG. 6A is supplied via selection terminal S, so that write clock signal CLK2 received into input terminal A is selected to be supplied as the clock of address generator 70. By this operation, address generator 70 generates the addresses augmented from zero to 255 to be provided as the address of second memory 72. Therefore, second memory 74 writes the music data for the third selection as I_E shown in FIG. 6B provided via AND gate 58 in accordance with the address continuously augmented from zero to 255. In address generator 70, the output value becomes zero once the counting value reaches 256 while being augmented from zero to 255. Then, the output is supplied to system controller 12 as the carry signal as shown in FIG. 6B. In step 109, system controller 12 determines whether the counting is augmented to 256 resulting from the input of the carry signal. If the counting is augmented to 256 in step 109, step 110 is executed to allow system controller 12 to set second channel memory selection signal E to one, thereby terminating the write operation into second memory 74.

When the music data write with respect to the third music selection is finished, system controller 12 supplies the third channel memory selection signal as F shown in FIG. 6A to memory controlling section 14 to permit the generation of the start address of the fifth music selection. Accordingly, system controller 12 provides the start address of the fifth selection stored in the syscon register to recording-medium address generator 46. Third channel memory selection signal F generated from system controller 12 is NAND processed via NAND gate 44 to be inverted as $\overline{F}$ shown in FIG. 6A, thereby clearing recording-medium address generator 46. Also, playback/record interval setting signal G is inverted into $\overline{G}$ as shown in FIG. 6A via inverter 40 to be supplied to AND gate 42. At this time, AND gate 42 performs the AND operation upon the write clock signal as CLK2 shown in FIG. 6 generated from system controller 12 and inverted playback/record interval setting signal $\overline{G}$ to be provided as the clock signal of recording-medium address generator 46. Therefore, recording-medium address generator 46 generates the address with respect to the fifth music selection to supply the result to recording medium 16 which reads out the music data with respect to the fifth music selection. Also, third channel memory selection signal F from system controller 12 is inverted via inverter 54 to be supplied to AND gate 60 which ANDs the data read out from recording medium 16 and inverted signal $\overline{F}$ to supply the logical product to third memory 76. At this time, since the third multiplexer 66 is supplied with the low signal corresponding to third channel memory selection signal F via selection terminal S, write clock signal CLK2 received via input terminal A is selected to be supplied to read/write loading terminal R/W of the third memory 76. Fourth multiplexer 68 is supplied with the low signal corresponding to playback/record selection setting signal as G shown in FIG. 6 via selection terminal S. Thus, write clock signal CLK2 received into input terminal A is selected to be supplied as the clock of address generator 70. In response to the clock, address generator 70 produces the addresses augmented from zero to 255, thereby providing the address as the address of third memory 76. Accordingly, third memory 76 writes the fifth music data as I_F shown in FIG. 6B, received via AND gate 60, in accordance with the address being augmented from zero to 255. Here, the output value of address generator 70 becomes zero when the counting value reaches 256 while being augmented from zero to 255, so that the output value is supplied to system controller 12 as the carry signal. Therefore, system controller 12 determines whether the counting value is augmented to 256 according to the input of the carry signal. In case of count augmenting to 256 in step 112, the program proceeds to step 113 to allow system controller 12 to set third channel memory selection signal F to one, thereby terminating the write operation into third memory 76. Thereafter, system controller 12 sets playback/record selection setting signal G to one to stop the access to first, second third memories 72, 74 and 76. Additionally, in step 114, system controller 12 checks whether a stop key is received from key input section 10 to stop the playback operation once the stop key stop is received, and exits the program. Meanwhile, no stop key input in step 114 denotes the state that the reproduction is being currently carried out. Consequently, step 115 is executed to allow system controller 12 to control read out of the music data stored in first, second and third memories 72, 74 and 76, respectively.

To describe the simultaneous reproduction of the music data, selected music data is stored in first to third memories 72, 74 and 76. First to third channel memory selection signals D, E and F are in the high state as shown in FIG. 6A. These signals are supplied, in turn, to selection terminals S of first to third multiplexers 62, 64 and 66, respectively. In this manner, first, second and third multiplexers 62, 64 and 66 select the read clock signal as CLK1 shown in FIG. 6A received via respective input terminals B, so that the selected signals are provided to read/write loading terminals R/W of first, second and third memories 72, 74 and 76 to force first, second and third multiplexers 62, 64 and 66 to operate in the read mode. The high state signals being first, second and third channel memory selections D, E and F are inverted via inverters 50, 52 and 54 to be supplied as respective inputs of three AND gates 56, 58 and 60 as the low signals. Accordingly, AND gates 56, 58 and 60 supply low signals to read out the input data of first, second and third memories 72, 74 and 76. Also, since fourth multiplexer 68 is supplied with the high signal corresponding to the playback/record interval setting signal as G shown in FIG. 6A, write clock signal CLK1 received via input terminal B is selected to be supplied as the clock of address generator 70. By this operation, address generator 70 produces the read address to first, second and third memories 72, 74 and 76. Therefore, first, second and third memories 72, 74 and 76 simultaneously read out music data corresponding the first, third and fifth music selections to provide them to first, second and third expanding sections 20, 22 and 24, respectively. The expanding sections expand the compressed music data per channel from first, second and third memories 72, 74 and 76. This music data is provided to first, second and third D/A converters 26, 28 and 30. First, second and third D/A converters 26, 28 and 30 respectively convert the digital music data expanded per channel from first, second and third expanding sections 20, 22 and 24 into the analog music data, thereby supplying the result to first, second and third amplifiers 32, 34 and 36. First, second and third amplifiers 32, 34 and 36 respectively amplify the signals converted into the analog music data in first, second and third D/A converters 20, 22 and 24 by the predetermined level, thereby providing them via L-channel output terminals and R-channel output terminals.

Here, the time for writing the data of 256 bytes should be within one cycle of read clock CLK1 for reading out the data of 256 bytes. For example, if read clock CLK1 is 44.1 kHz, the data of 256 bytes*3 can be recorded in first, second and third memories 72, 74 and 76 within one cycle of read clock CLK1 only when write clock CLK2 exceeds 34 MHz. Furthermore, the operation can be stable when the memory access time is at least 30 ns.

In another embodiment of the present invention, unless the music data recorded on recording medium 16 is compressed, the apparatus may be modified to exclude first to third expanding sections 20, 22 and 24 as shown in FIG. 1 for enabling the simultaneous reproduction of several pieces of music without departing from the scope of the invention.

As a result, when the plurality of music data recorded on the recording medium is selected to be reproduced in the acoustic reproduction apparatus, the selected number of music data is sequentially transferred to be stored in respective channel memories. Then, upon the completion of storage, the music data stored per channel is simultaneously reproduced. In this manner, many people can simultaneously listen several pieces of music via a single music reproducing apparatus.

Therefore, it should be understood that the present invention is not limited to the particular embodiment disclosed herein as the best mode contemplated for carrying out the present invention. The present invention is not limited to the specific embodiments described in this specification, but includes all that is encompassed by the appended claims.

What is claimed is:

1. An apparatus for simultaneously reproducing multiple audio signals recorded on a recording medium such that the multiple audio signals recorded on said medium can be selectively reproduced comprising:

key input means, provided with various function keys, for selecting audio signals recorded on said recording medium;

system controlling means for generating read and write clocks to control the timing of the reading of said multiple audio signals, for generating an interval setting signal, and for generating channel memory selection signals in response to said key input means;

memory controlling means for generating addresses for reading out said audio signals from said recording medium under the control of said interval setting signal and said write clock of said system controlling means; and data separating means for receiving the multiple audio signals read out from said recording medium, and for storing and simultaneously outputting said multiple audio signals in respective channels in accordance with said channel memory selection signal, read clock signal, and write clock signal output by said system controlling means.

2. An apparatus for simultaneously reproducing multiple audio signals recorded on a recording medium such that the multiple audio signals recorded on said medium can be selectively reproduced comprising:

key input means, provided with various function keys, for selecting audio signals recorded on said recording medium;

system controlling means for generating read and write clocks to control the timing of the reading of said multiple audio signals, for generating an interval setting signal, and for generating channel memory selection signals in response to said key input means;

memory controlling means for generating addresses for reading out said audio signals from said recording medium under the control of said interval setting signal and said write clock of said system controlling means; and data separating means for receiving the multiple audio signals read out from said recording medium, and for storing and outputting said multiple audio signals in respective channels in accordance with said channel memory selection signal, read clock signal, and write clock signal output by said system controlling means;

wherein said memory controlling means comprises:

an inverter for inverting said interval setting signal generated by said system controlling means;

an AND gate for performing the AND operation upon 1) the inverted interval setting output by said inverter and 2) said write clock signal generated by said system controlling means;

recording-medium address generating means for receiving a pre-set address from said system controlling means and receiving the output from said AND gate to generate a recording medium address; and a NAND gate for performing the NAND operation upon said channel memory selection signals generated by said system controlling means to clear said recording-medium address generating means.

3. An apparatus for reproducing multiple audio signals as claimed in claim 2, wherein said data separating means comprises:

inverting means for inverting said channel memory selection signals generated by said system controlling means;

AND means for performing the AND operation upon 1) said audio signals output from said recording medium and 2) said inverted channel memory selection signals;

first clock selecting means for receiving said read clock signal and write clock signal generated by said system controlling means to select one of said read out and write clock signals in accordance with said channel memory selection signals;

second clock selecting means for selecting one of said read and write clock signals in accordance with said channel memory selection signals; and address generating means, responsive to the output of said second cock selecting means after being cleared by a signal from said system controlling means, for generating read and write addresses for a plurality of memories, wherein said memories receive and output said audio signals in accordance with said read and write addresses generated by said address generating means.

4. An apparatus for simultaneously reproducing multiple audio signals recorded on a recording medium recorded with compressed data such that the multiple audio signals recorded on said medium can be selectively reproduced comprising:

key input means, provided with various function keys, for selecting audio signals recorded on said recording medium;

system controlling means for generating read and write clocks to control the timing of the reading of said multiple audio signals, for generating an interval setting signal, and for generating channel memory selection signals in response to said key input means;

memory controlling means for generating addresses for reading out said audio signals from said recording medium under the control of said interval setting signal and said write clock of said system controlling means;

data separating means for receiving the multiple audio signals read out from said recording medium, and for storing and simultaneously outputting said multiple audio signals in respective channels in accordance with said channel memory selection signal, read clock signal, and write clock signal output by said system controlling means; and expanding means for expanding said compressed data read out from said respective channels by said separating means.

5. An apparatus for simultaneously reproducing multiple audio signals recorded on a recording medium recorded with compressed data such that the multiple audio signals recorded on said medium can be selectively reproduced comprising:

key input means, provided with various function keys, for selecting audio signals recorded on said recording medium;

system controlling means for generating read and write clocks to control the timing of the reading of said multiple audio signals, for generating an interval setting signal, and for generating channel memory selection signals in response to said key input means;

memory controlling means for generating addresses for reading out said audio signals from said recording medium under the control of said interval setting signal and said write clock of said system controlling means;

data separating means for receiving the multiple audio signals read out from said recording medium, and for storing and outputting said multiple audio signals in respective channels in accordance with said channel memory selection signal, read clock signal, and write clock signal output by said system controlling means; and expanding means for expanding said compressed data read out from said respective channels by said separating means;

wherein said memory controlling means comprises:

an inverter for inverting said interval setting signal generated by said system controlling means;

an AND gate for performing the AND operation upon 1) the inverted interval setting output by said inverter and 2) said write clock signal generated by said system controlling means;

recording-medium address generating means for receiving a pre-set address from said system controlling means and receiving the output from said AND gate to generate a recording medium address; and a NAND gate for performing the NAND operation upon said channel memory selection signals generated by said system controlling means to clear said recording-medium address generating means.

6. An apparatus for reproducing multiple audio signals as claimed in claim 5, wherein said data separating means comprises:

inverting means for inverting said channel memory selection signals generated by said system controlling means;

AND means for performing the AND operation upon 1) said audio signals output from said recording medium and 2) said inverted channel memory selection signals;

first clock selecting means for receiving said read clock signal and write clock signal generated by said system controlling means to select one of said read out and write clock signals in accordance with said channel memory selection signals;

second clock selecting means for selecting one of said read and write clock signals in accordance with said channel memory selection signals; and address generating means, responsive to the output of said second clock selecting means after being cleared by a signal from said system controlling means, for generating read and write addresses for a plurality of memories, wherein said memories receive and output said audio signals in accordance with said read and write addresses generated by said address generating means.

7. A method for simultaneously reproducing multiple audio signals recorded on a recording medium such that multiple audio signals recorded on said medium can be selectively reproduced, said method comprising the steps of:

selecting a plurality of audio signals;

sequentially reading out the selected audio signals from said recording medium;

storing the audio signals read out from said recording medium; and simultaneously reading out said stored signals.

8. The method of reproducing multiple audio signals of claim 7, further comprising the step of:

amplifying said simultaneously read out signals.

9. The method of reproducing multiple audio signals of claim 7, wherein in said storing step, said audio signals are stored in a plurality of memories and said storing step further comprises the steps of:

setting a counter to a first designated address to store said audio signal corresponding to a respective selected audio signal in said first designated address in a first memory;

incrementing said counter to successively store said audio signal in subsequent addresses;

stopping the storage of information to said first memory when said counter reaches a second designated address; and repeating said setting step, said incrementing step, and said stopping step for a subsequently selected audio signal in a subsequent memory until each said selected audio signals is stored in a respective memory.

10. A method for simultaneously reproducing multiple audio signals recorded on a recording medium such that multiple audio signals recorded on said medium can be selectively reproduced, said method comprising the steps of:

selecting a plurality of audio signals;

sequentially reading out the selected audio signals from said recording medium;

classifying audio signals read out from recording medium in accordance with a kind of music;

storing said audio signals read out from said recording medium; and simultaneously reading out said stored signals.

* * * * *